(12) United States Patent
Park

(10) Patent No.: US 11,322,435 B2
(45) Date of Patent: May 3, 2022

(54) PACKAGE SUBSTRATE HAVING POWER TRACE PATTERN AND GROUND TRACE PATTERN, AND SEMICONDUCTOR PACKAGE INCLUDING THE SAME

(71) Applicant: SK hynix Inc., Icheon-si (KR)

(72) Inventor: Jeong Hyun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/924,736

(22) Filed: Jul. 9, 2020

(65) Prior Publication Data

US 2021/0242121 A1 Aug. 5, 2021

(30) Foreign Application Priority Data

Jan. 31, 2020 (KR) .......................... 10-2020-0011606

(51) Int. Cl.
*H01L 23/498* (2006.01)
*H01L 23/00* (2006.01)

(52) U.S. Cl.
CPC .. *H01L 23/49838* (2013.01); *H01L 23/49822* (2013.01); *H01L 24/48* (2013.01); *H01L 2224/48227* (2013.01)

(58) Field of Classification Search
CPC ................ H01L 24/48; H01L 23/49838; H01L 2224/48227; H01L 23/49822
See application file for complete search history.

(56) References Cited

U.S. PATENT DOCUMENTS

| 8,198,724 | B1 * | 6/2012 | Wu | .................... | H01L 23/49822 |
| | | | | | 257/691 |
| 9,609,742 | B2 | 3/2017 | Jang et al. | | |
| 2004/0183167 | A1 * | 9/2004 | Hortaleza | ............. | H01L 23/562 |
| | | | | | 257/666 |
| 2005/0098886 | A1 * | 5/2005 | Pendse | .............. | H01L 23/49838 |
| | | | | | 257/738 |

FOREIGN PATENT DOCUMENTS

KR 101218011 B1 1/2013

* cited by examiner

*Primary Examiner* — Jasmine J Clark
(74) *Attorney, Agent, or Firm* — William Park & Associates Ltd.

(57) ABSTRACT

A package substrate according to an aspect of the disclosure includes a substrate body, and a first power trace pattern and a first ground trace pattern disposed on a first surface of the substrate body. The first power trace pattern has a parent power line portion and at least one child power line portion branched from the parent power line portion, and the first ground trace pattern has a parent ground line portion and at least one child ground line portion branched from the parent ground line portion. At least a portion of the first power trace pattern is disposed to surround at least a portion of the first ground trace pattern, and at least a portion of the first ground trace pattern is disposed to surround at least a portion of the first power trace pattern.

20 Claims, 8 Drawing Sheets

PACKAGE SUBSTRATE HAVING POWER TRACE PATTERN AND GROUND TRACE PATTERN, AND SEMICONDUCTOR PACKAGE INCLUDING THE SAME

CROSS-REFERENCE TO RELATED APPLICATIONS

The present application claims priority under 35 U.S.C 119(a) to Korean Application No. 10-2020-0011606, filed on Jan. 31, 2020, which is incorporated herein by references in its entirety.

BACKGROUND

1. Technical Field

The present disclosure generally relates to a package substrate and a semiconductor package including the same and, more particularly, to a package substrate having a power trace pattern and a ground trace pattern, and a semiconductor package including the same.

2. Related Art

The semiconductor industry has evolved in the direction of manufacturing semiconductor products having light weight, small size, high speed, multi-functionality, high performance, and high reliability at low cost, and one of the important technologies to achieve such products is semiconductor package technology. Semiconductor package technology is a technology of mounting a semiconductor chip having a circuit portion formed on a package substrate through a wafer process, a technology of securing an electrical connection between a semiconductor chip and an external electronic device through the package substrate, and a technology of protecting the semiconductor chip from an external environment.

Recently, in response to a drive for lighter and shorter package products, various corresponding design techniques for a package substrate have been studied. In addition, in response to the thinning of the package substrate, research into circuit pattern design techniques that guarantee the stability and reliability of device operations in a package substrate has been continued.

SUMMARY

A package substrate according to an aspect of the disclosure includes a substrate body, and a first power trace pattern and a first ground trace pattern disposed on a first surface of the substrate body. The first power trace pattern has a parent power line portion and at least one child power line portion branched from the parent power line portion, and the first ground trace pattern has a parent ground line portion and at least one child ground line portion branched from the parent ground line portion. At least a portion of the first power trace pattern is disposed to surround at least a portion of the first ground trace pattern, and at least a portion of the first ground trace pattern is disposed to surround at least a portion of the first power trace pattern.

A semiconductor package according to another aspect of the disclosure includes a package substrate and a semiconductor chip mounted on the package substrate. The package substrate includes a substrate body having a first surface and a second surface different from the first surface, a first power trace pattern and a first ground trace pattern alternately disposed on the first surface, and a second power trace pattern and a second ground trace pattern alternately disposed on the second surface. The first and second power trace patterns are electrically connected to each other by power line vias and the first and second ground patterns are electrically connected to each other by ground line vias. The first power trace pattern and the second ground trace pattern are disposed to overlap each other in a direction perpendicular to the first and second surfaces. The first ground trace pattern and the second power trace pattern are disposed to overlap each other in a direction perpendicular to the first and second directions.

DETAILED DESCRIPTION

Figure 1:
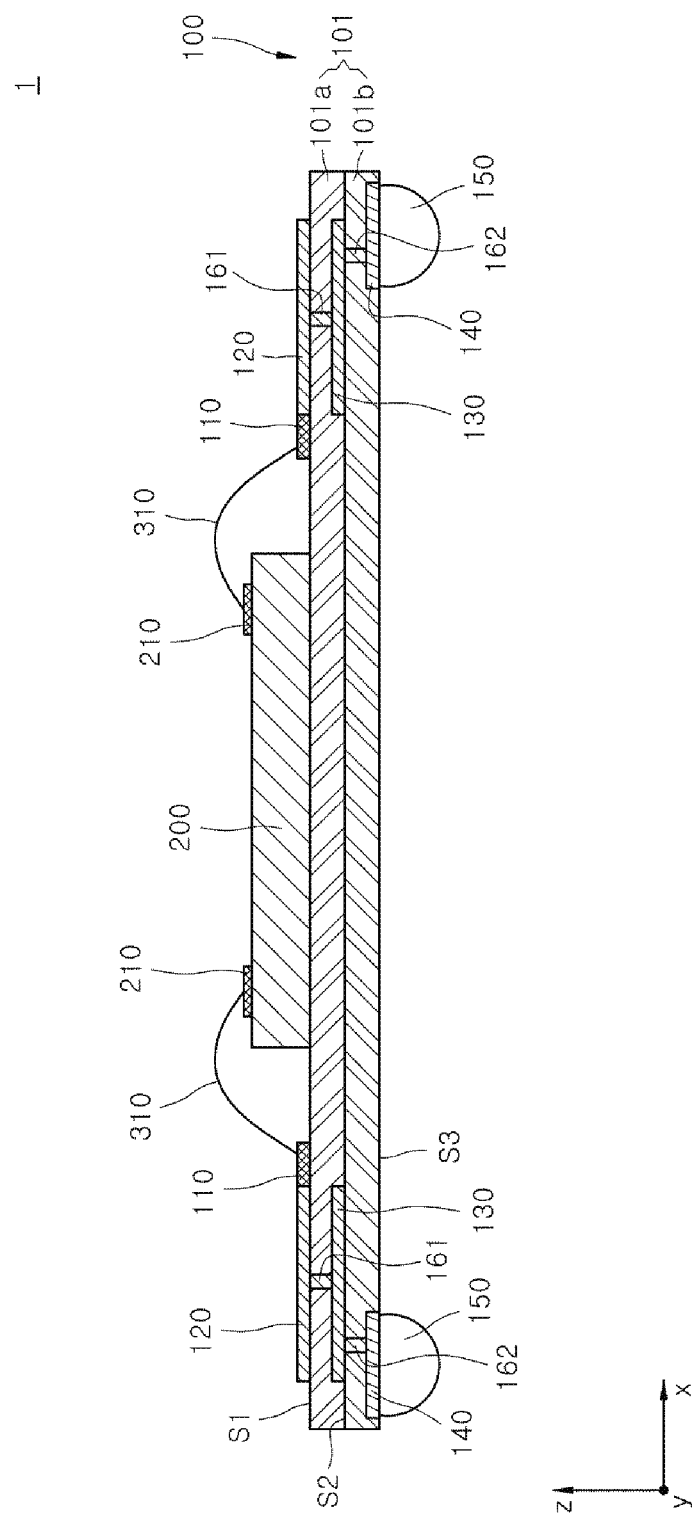
FIG. 1 is a cross-sectional view illustrating a semiconductor package according to an embodiment of the present disclosure.

The terms used herein may correspond to words selected in consideration of their functions in the embodiments, and the meanings of the terms may be construed to be different according to one of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. In the description of the example of the present disclosure, descriptions such as "first" and "second" and "upper" and "lower" are for distinguishing members, and are not used to limit the members themselves or to mean a specific order.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating a semiconductor package 1 according to an embodiment of the present disclosure. Referring to FIG. 1, the semiconductor package 1 may include a package substrate 100 and a semiconductor chip 200 mounted on the package substrate 100. The package substrate 100 and the semiconductor package 200 may be electrically connected by bonding wires 310.

The package substrate 100 may have a substrate body 101. The substrate body 101 may include a first interlayer insulation layer 101a and a second interlayer insulation layer 101b. The substrate body 101 may have a first surface S1, a second surface S2, and a third surface S3. The first surface S1 may be an upper surface of the first interlayer insulation layer 101a. The second surface S2 may be an internal surface of the substrate body 101 and may be an interface between the first interlayer insulation layer 101a and the second interlayer insulation layer 101b. The third surface S3 may be a lower surface of the second interlayer insulation layer 101b.

Bonding pads 110 may be disposed on the first surface S1 of the substrate body 101. The bonding pads 110 may each function as a bonding finger for wire bonding with the semiconductor chip 200. First wirings 120 electrically connected to the bonding pads 110 may be disposed on the first surface S1 of the substrate body 101. Each of the first wirings 120 may include a first power trace pattern (not illustrated) and a first ground trace pattern (not illustrated).

Second wirings 130 may be disposed on the second surface S2 of the substrate body 101. Each of the second wirings 130 may include a second power trace pattern (not illustrated) and a second ground trace pattern (not illustrated).

Bump pads 140 may be disposed on the third surface S3 of the substrate body 101. In an embodiment, a lower surface of each of the bump pads 140 may be exposed on the same plane as the third surface S3, and the rest except for the lower surface may be buried by the second interlayer insulation layer 101b.

Connection structures 150 may be disposed on the lower surface of each of the bump pads 140. The connection structures 150 may, for example, be bumps or solder balls. The connection structures 150 may be connected to an external printed circuit board (PCB) or an external system. Meanwhile, the connection structures 150 may be classified into a power pin structure, a ground pin structure, and an input/output pin structure according to functions performed. Although not specifically illustrated in FIG. 1, the semiconductor package 1 may include a power pin structure, a ground pin structure, and an input/output pin structure as the connection structure 150. The power pin structure, the ground pin structure, and the input/output pin structure may be spaced apart from each other on the third surface S3.

Referring back to FIG. 1, first vias 161 may be disposed inside the first interlayer insulation layer 101a. The first vias 161 may electrically connect the first wirings 120 to the second wirings 130. Second vias 162 may be disposed inside the second interlayer insulation layer 101b. The second vias 162 may electrically connect the bump pads 140 to the second wirings 130.

As described later, in the embodiments of the disclosure, when the connection structure 150 is the power pin structure, the bump pad 140 (i.e., power line bump pad), the second via 162 (i.e., second power line via), the second wiring 130 (i.e., the second power trace pattern), the first via 161 (i.e., the first power line via), the first wiring 120 (i.e., the first power trace pattern), and the bonding pad 110 (i.e., the power pad) may be disposed as an internal wiring electrically connected to the power pin structure. When the connection structure 150 is the ground pin structure, the bump pad 140 (i.e., the ground line bump pad), the second via 162 (i.e., the second ground line via), the second wiring 130 (i.e., the second ground trace pattern), the first via 161 (i.e., the first ground line via), the first wiring 120 (i.e., the first ground trace pattern), and the bonding pad 110 (i.e., the ground pads) may be disposed as another internal wiring electrically connected to the ground pin structure.

In this case, as described later in connection with FIGS. 2A to 2C, 3, 4, 5A and 5B, the first power trace pattern and the first ground trace pattern may be disposed adjacent to each other on the first surface S1. The second power trace pattern and the second ground trace pattern may be disposed adjacent to each other on the second surface S2.

In addition, as described later in connection with FIGS. 2A to 2C, 3, 4, 5A and 5B, the first power trace pattern on the first surface S1 may be disposed to overlap with the second ground trace pattern on the second surface S2. The first ground trace pattern on the first surface S1 may be disposed to overlap with the second power trace pattern on the second surface S2.

Figure 2A:
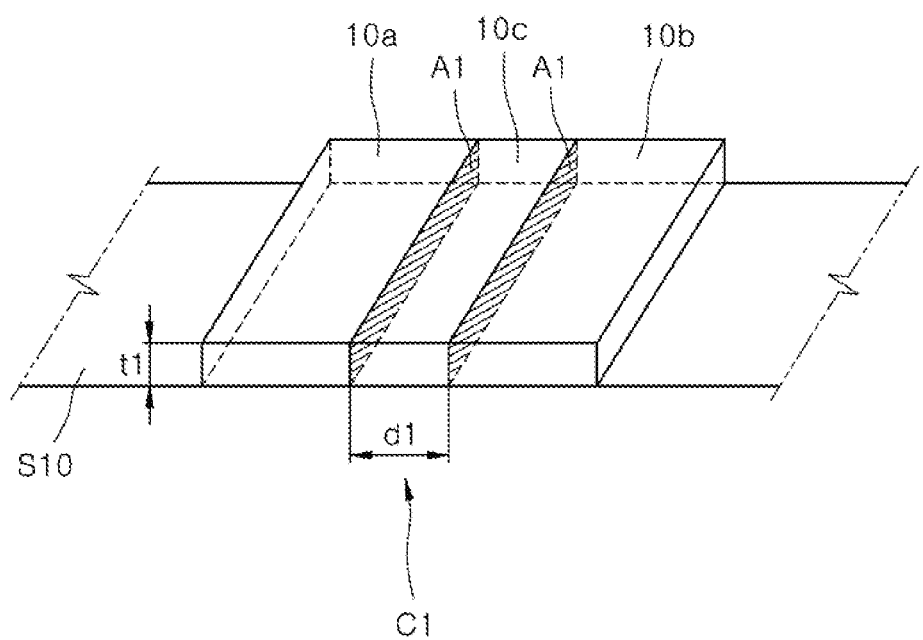
FIGS. 2A to 2C are views illustrating a power trace pattern and a ground trace pattern according to an embodiment of the present disclosure.
Figure 2B:
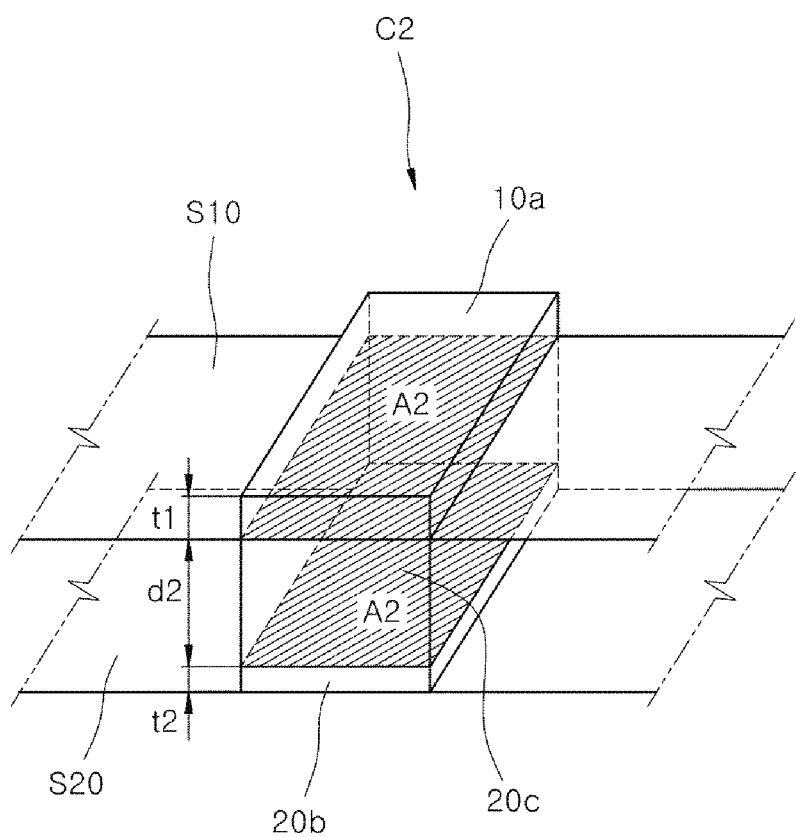
Figure 2C:
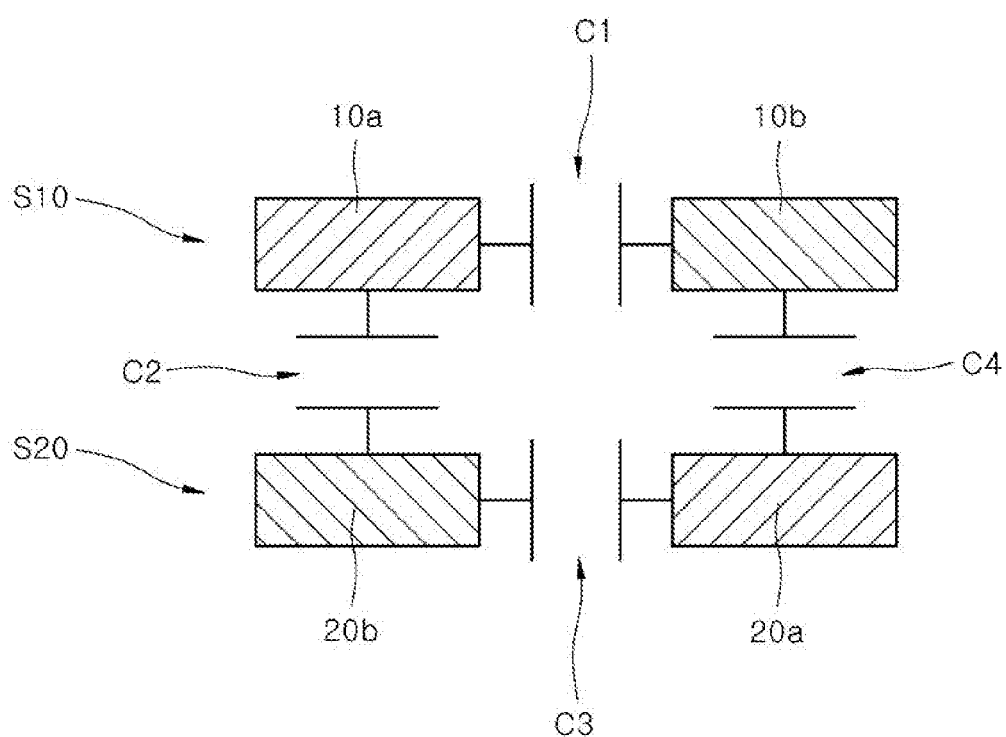

FIGS. 2A to 2C are views illustrating a power trace pattern and a ground trace pattern according to an embodiment of the present disclosure. Specifically, FIG. 2A is a view schematically illustrating a capacitor element formed according to the arrangement of the power trace pattern and the ground trace pattern on the same plane. FIG. 2B is a view schematically illustrating a capacitor element formed according to the arrangement of the power trace pattern and the ground trace pattern on different planes. FIG. 2C is a schematic view illustrating power transmission characteristics due to a capacitor element formed according to the arrangement of a power trace pattern and a ground trace pattern according to an embodiment of the present disclosure.

Referring to FIG. 2A, a first power trace pattern 10a and a first ground trace pattern 10b may be disposed on a first plane S10. The first power trace pattern 10a and the first ground trace pattern 10b may be disposed to be spaced apart from each other at a distance d1. A first insulation layer 10c that functions as a dielectric may be interposed between the first power trace pattern 10a and the first ground trace pattern 10b. The first power trace pattern 10a, the first insulation layer 10c, and the first ground trace pattern 10b may each have a thickness t1 on the first plane S10. In the embodiment, the first power trace pattern 10a, the first insulation layer 10c, and the first ground trace pattern 10b may constitute a first capacitor element C1 on the first plane S10. When each of the first power trace pattern 10a and the first ground trace pattern 10b has a side area A1, the capacitance of the first capacitance element C1 on the first plane S10 may be proportional to the product of the dielectric constant and the side area A1 of the first insulation layer 10c and may be inversely proportional to the distance d1 between the first power trace pattern 10a and the first ground trace pattern 10b.

Meanwhile, in the semiconductor package 1 of FIG. 1, the power supplied from an external system may be input to the connection structures 150 and output through the bonding pads 110 to be transferred to the semiconductor chip 200, passing through the bump pads 140, the second vias 162, the second wirings 130, the first vias 161, and the first wirings 120. Also, when performing various calculation and control operations on the semiconductor chip 200, the power may be consumed. In the embodiment, the first capacitor element C1 may be formed on the first plane S10 by the first power trace pattern 10a and the first ground trace pattern 10b. In the embodiment, new power can be replenished more quickly from inside the package substrate 100 through the first capacitor element C1 in response to the consumed power. That is, the first capacitor element C1 may serve as a preliminary power source disposed on the package substrate 100. Accordingly, a voltage drop phenomenon during device operation may be prevented to help the semiconductor package operate smoothly.

Referring to FIG. 2B, a first power trace pattern 10a may be disposed on the first plane S10 and a second ground trace pattern 20b may be disposed on a second plane S20 that is different from the first plane S10. The first power trace pattern 10a and the second ground trace pattern 20b may be disposed to overlap each other on different planes. The second ground trace pattern 20b may have a second thickness t2. The first power trace pattern 10a and the second ground trace pattern 20b may be disposed to be spaced apart from each other at a distance d2. A second insulation layer 20c that functions as a dielectric may be interposed between the first power trace pattern 10a and the second ground trace pattern 20b.

In the embodiment, the first power trace pattern 10a, the second insulation layer 20c, and the second ground trace pattern 20b may constitute a second capacitor element C2 in a direction perpendicular to the first and second planes S10 and S20. The first power trace pattern 10a may have an area A2 on the first plane S10, and the second ground trace pattern 20b may have the same area A2 on the second plane S20. That is, the first power trace pattern 10a and the second ground trace pattern 20b may have the area A2 overlapping each other. Here, the capacitance of the second capacitor element C2 may be proportional to the product of the dielectric constant of the second insulation layer 20c and the overlapping area A2 and may be inversely proportional to the distance d2 between the first power trace pattern 10a and the second ground trace pattern 20b.

In the embodiment, the second capacitor element C2 formed in a direction perpendicular to the first and second planes S10 and S20 can supply power to the first power trace pattern 10a. Accordingly, during operation of the semiconductor package that consumes external power, new power can be quickly replenished with respect to the consumed external power. Accordingly, the second capacitor element C2 can stably maintain the power supplied into the semiconductor package.

Referring to FIG. 2C, a first power trace pattern 10a and a first ground trace pattern 10b may be disposed adjacent to each other on a first plane S10. In addition, a second power trace pattern 20a and a second ground trace pattern 20b may be disposed adjacent to each other on a second plane S2 which is a plane different from the first plane S10. The first power trace pattern 10a and the second ground trace pattern 20b may be disposed to overlap each other in a direction perpendicular to the first and second planes S10 and S20. In addition, the first ground trace pattern 10b and the second power trace pattern 20a may be disposed to overlap each other in a direction perpendicular to the first and second planes S10 and S20. Meanwhile, a first insulation layer (not illustrated) that functions as a dielectric may be interposed between the first power trace pattern 10a and the first ground trace pattern 10b on the first plane S10. A second insulation layer (not illustrated) that functions as a dielectric may be interposed between the first power trace pattern 10a of the first plane S10 and the second ground trace pattern 20b of the second plane S20. A third insulation layer (not illustrated) that functions as a dielectric may be interposed between the second ground trace pattern 20b and the second power trace pattern 20a on the second plane S20. A fourth insulation layer (not illustrated) that functions as a dielectric may be interposed between the first ground trace pattern 10b of the first plane S10 and the second power trace pattern 20a of the second plane S20.

Through the above arrangement, a first capacitor element C1 may be formed on the first plane S10 by the first power trace pattern 10a, the first insulation layer, and the first ground trace pattern 10b. A second capacitor element C2 may be formed between the first plane S10 and the second plane S20 by the first power trace pattern 10a, the second insulation layer, and the second ground trace pattern 20b. A third capacitor element C3 may be formed on the second plane S20 by the second power trace pattern 20a, the third insulation layer, and the second ground trace pattern 20b. A fourth capacitor element C4 may be formed between the first plane S10 and the second plane S20 by the second power trace pattern 20a, the fourth insulation layer, and the first ground trace pattern 10b. The first to fourth capacitor elements C1, C2, C3, and C4 can supply electric charges to the first power trace pattern 10a or the second power trace pattern 20, respectively. Accordingly, during operation of the semiconductor package that consumes external power, the first to fourth capacitor elements C1, C2, C3, and C4 can quickly replenish new power with respect to the consumed external power, so that the power supplied to the semiconductor package can be stably maintained.

Figure 3:
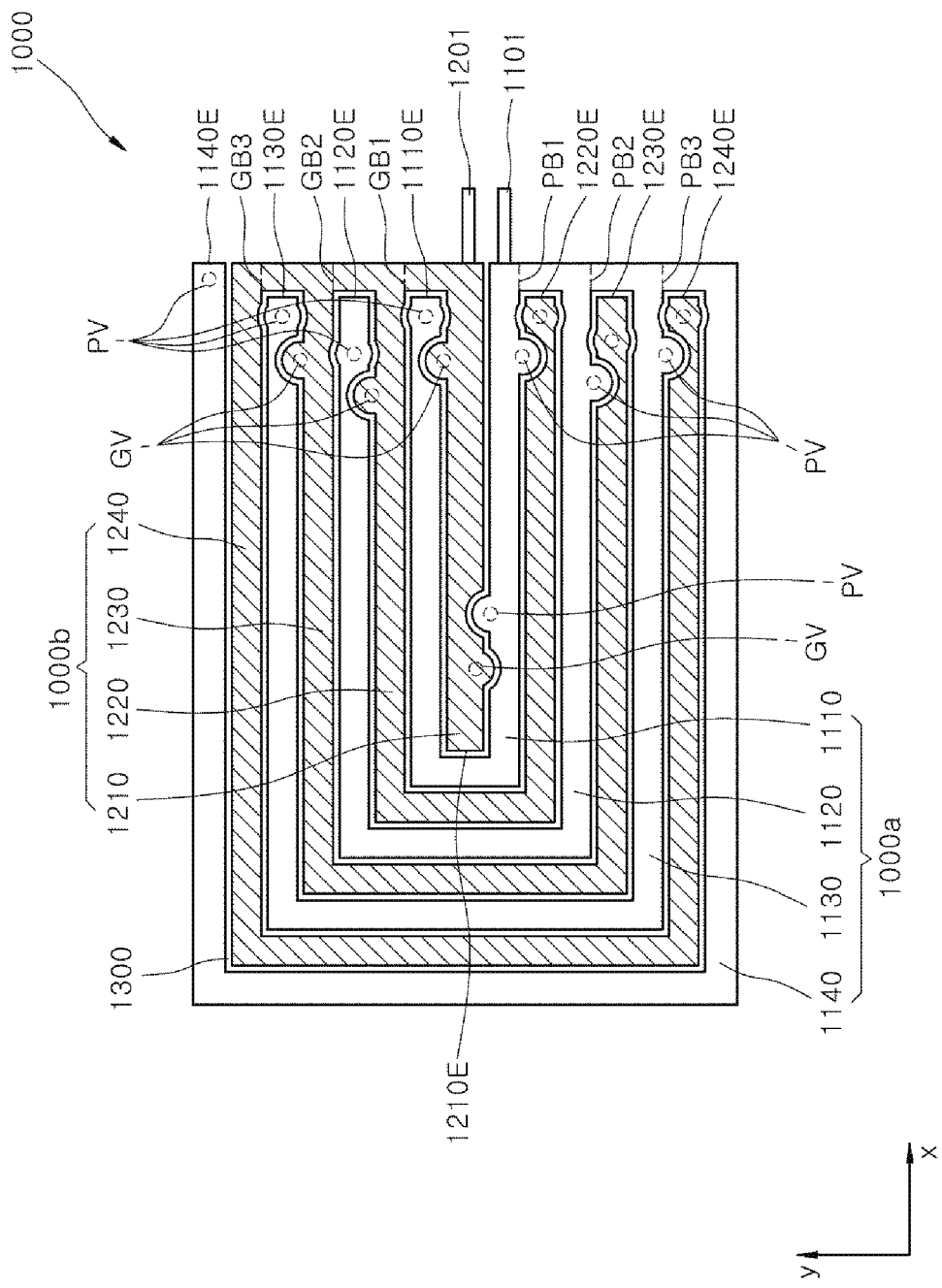
FIG. 3 is a view illustrating a trace pattern disposed on one surface of a package substrate according to an embodiment of the present disclosure.
Figure 4:
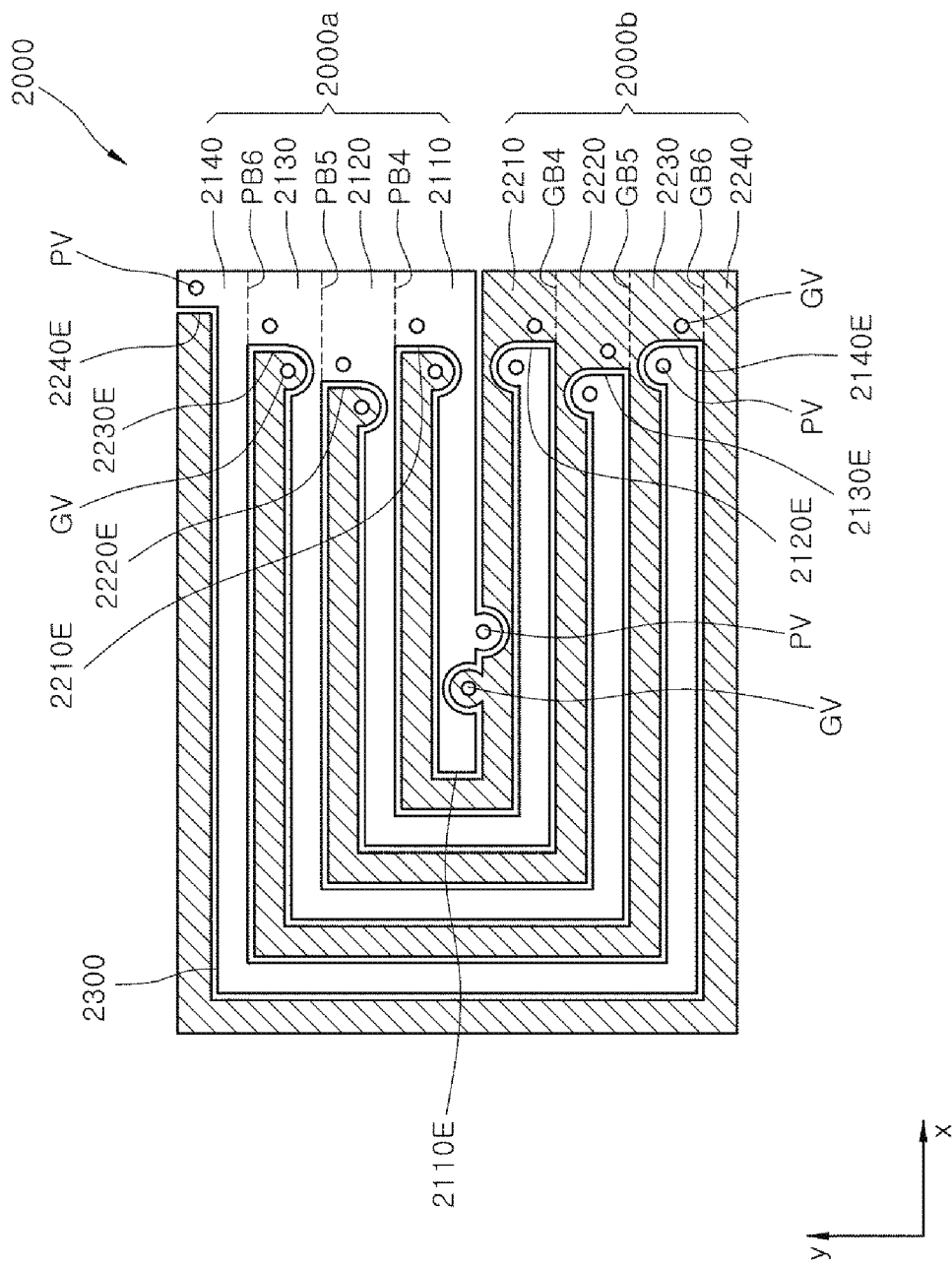
FIG. 4 is a view illustrating a trace pattern disposed on another surface of a package substrate according to an embodiment of the present disclosure.
Figure 5A:
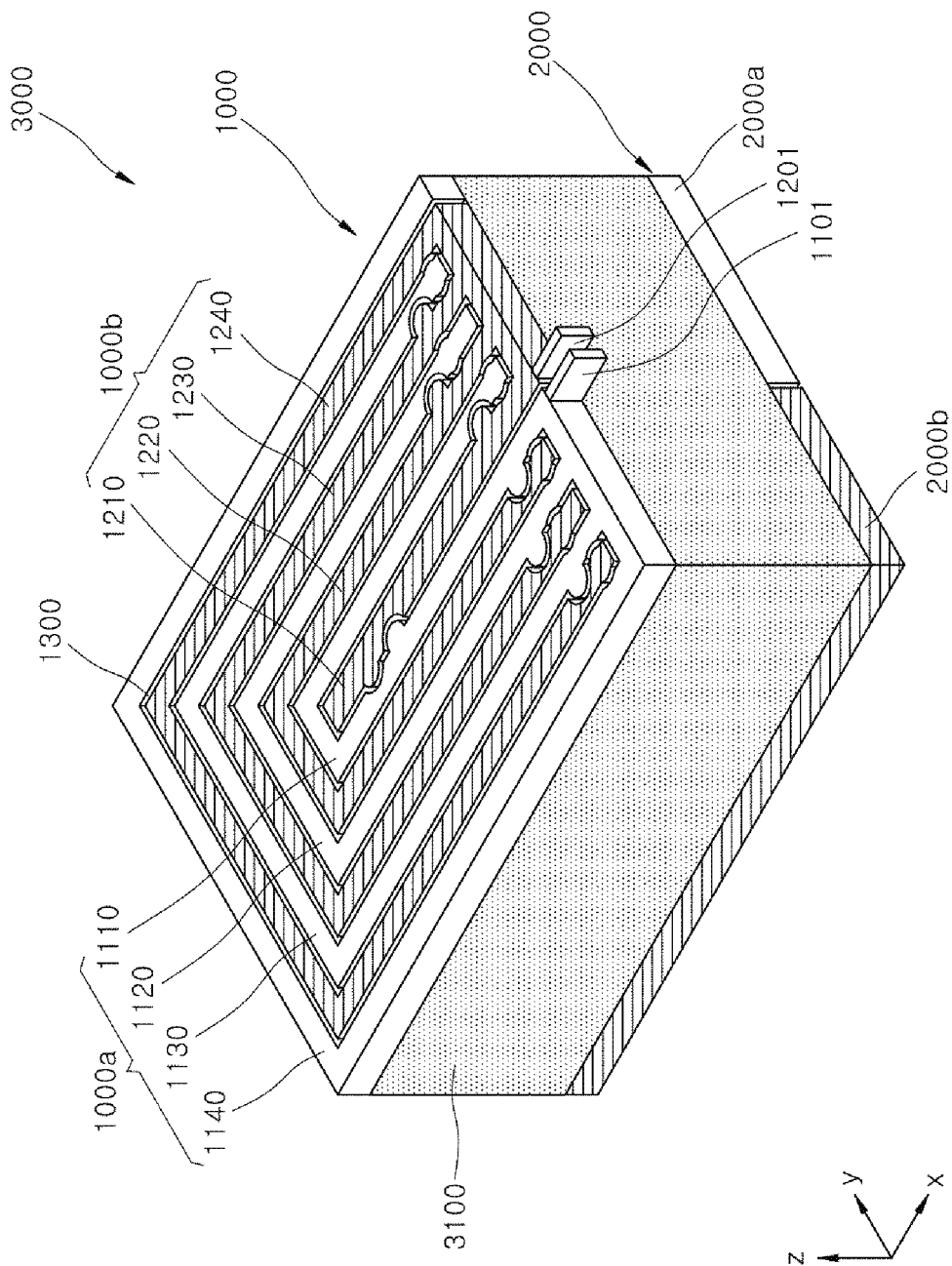
FIG. 5A is a perspective view illustrating a package substrate including trace patterns disposed on different surfaces in an embodiment of the present disclosure.
Figure 5B:
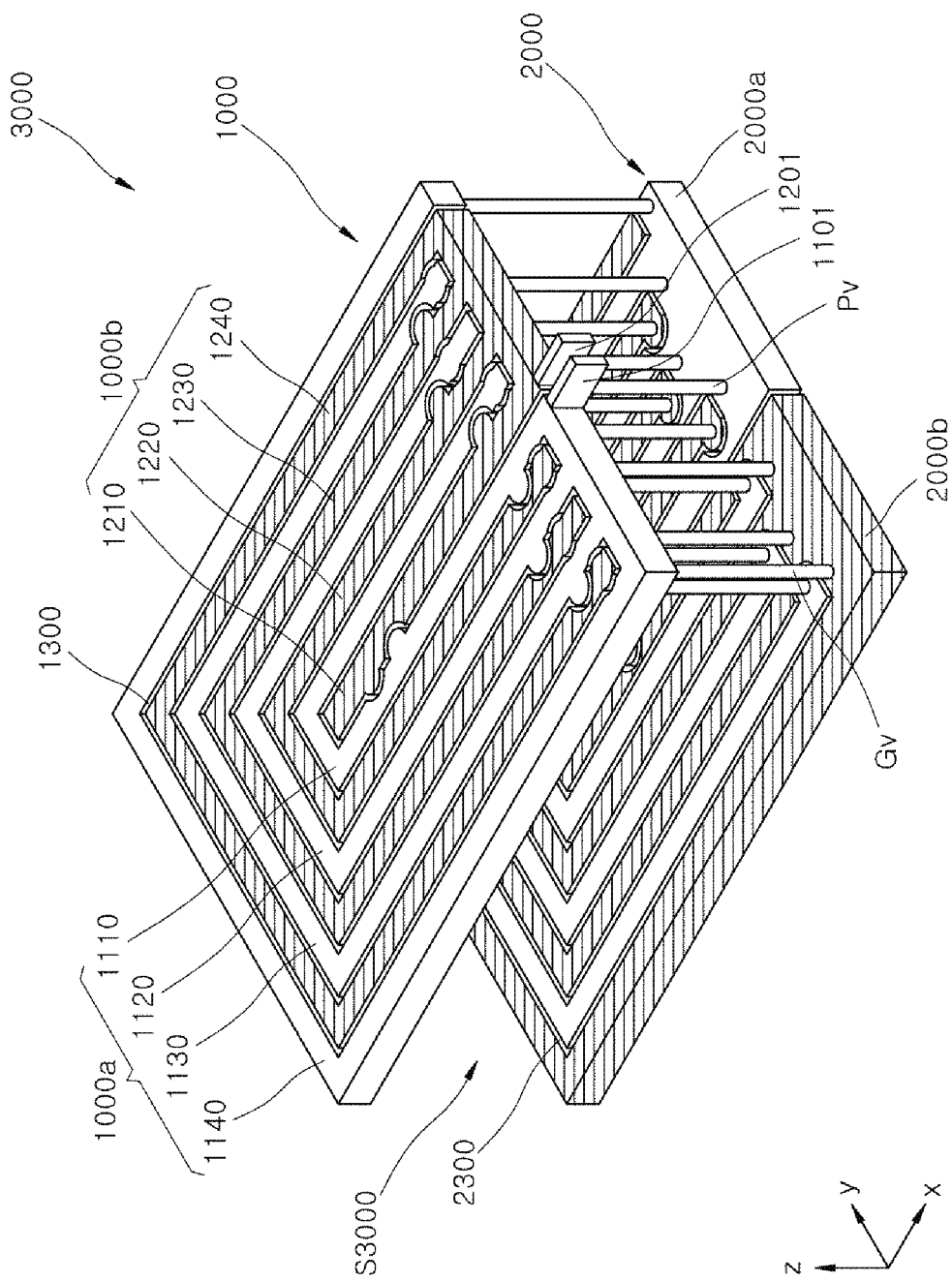
FIG. 5B is a view illustrating an internal structure of the package substrate of FIG. 5A.

FIG. 3 is a view illustrating trace patterns disposed on one surface of a package substrate according to an embodiment of the present disclosure. FIG. 4 is a view illustrating trace patterns disposed on another surface of the package substrate according to an embodiment of the present disclosure. FIG. 5A is a perspective view illustrating a package substrate including trace patterns disposed on different surfaces in an embodiment of the present disclosure. FIG. 5B is a view illustrating an internal structure of the package substrate of FIG. 5A, and a third insulation layer 3100 of FIG. 5A is omitted in FIG. 5B. FIG. 5B illustrates the structure of the package substrate in which the trace patterns of FIG. 3 and the trace patterns of FIG. 4 are connected through vias.

A trace pattern 1000 of FIG. 3 may be a portion of the first wiring 120 disposed on the first surface S1 in the package substrate 100 described above with reference to FIG. 1. A trace pattern 2000 of FIG. 4 may be a portion of the second wiring 130 disposed on the second surface S2 in the package substrate 100 described above with reference to FIG. 1. Hereinafter, for convenience of description, the trace pattern 1000 of FIG. 3 is referred to as a first trace pattern 1000, and the trace pattern 2000 of FIG. 4 is referred to as a second trace pattern 2000.

Referring to FIG. 3, the first trace pattern 1000 may include a first power trace pattern 1000a and a first ground trace pattern 1000b.

One end of the first power trace pattern 1000a may be connected to a power pad 1101 and one end of the ground trace pattern 1000b may be connected to a ground pad 1201. The power pad 1101 and the ground pad 1201 may be disposed adjacent to each other. However, the power pad 1101 and the ground pad 1201 may be electrically insulated from each other by being spaced apart from each other.

The power pad 1101 and the ground pad 1201 may correspond to the bonding pads 110 disposed on the first surface S1 of the substrate body 101 of FIG. 1. The power pad 1101 may be wire-bonded to a power chip pad among the chip pads 210 of the semiconductor chip 200 mounted on the first surface S1. The ground pad 1201 may be wire-bonded to a ground chip pad among the chip pads 210 of the semiconductor chip 200.

The first power trace pattern 1000a may include a parent power line portion 1110 connected to the power pad 1101 and first to third child power line portions 1120, 1130, and 1140 that are branched from the parent power line portion 1110. The first ground trace pattern 1000b may include a parent ground line portion 1210 connected to the ground pad 1201 and first to third child ground line portions 1220, 1230, and 1240 that are branched from the parent ground line portion 1210.

The first power trace pattern 1000a and the first ground trace pattern 1000b may be disposed adjacent to each other. The first power trace pattern 1000a and the first ground trace pattern 1000b may be electrically insulated from each other by being spaced apart from each other. In an embodiment, at least a portion of the first power trace pattern 1000a may be disposed to surround at least a portion of the first ground trace pattern 1000b, and at least a portion of the first ground trace pattern 1000b may be disposed to surround at least a portion of the first power trace pattern 1000a, as illustrated in FIG. 3. Referring back to FIG. 3, a first insulation layer 1300 that functions as a dielectric may be disposed between the first power trace pattern 1000a and the first ground trace pattern 1000b. Accordingly, in a region where the first power trace pattern 1000a, the first insulation layer 1300, and the first ground trace pattern 1000b overlap each other, a capacitor element having substantially the same configuration as the first capacitor element C1 described with reference to FIG. 2A may be formed.

Referring back to FIG. 3, the parent power line portion 1110 may be disposed adjacent to the parent ground line portion 1210. The parent power line portion 1110 may be disposed to surround the parent ground line portion 1210. The parent power line portion 1110 may extend from one end connected to the power pad 1101 in the form of a '⊏' pattern or shape to reach the other end 1110E.

A power line via PV connected to the second parent power line portion 2110 of the second power trace pattern 2000a of FIG. 4 may be connected to the parent power line portion 1110. As illustrated in FIG. 3, the power line via PV may be disposed at the center of the first trace pattern 1000 and may also be disposed adjacent to the one end and the other end 1110E of the parent power line portion 1110. The one end may be disposed adjacent to a boundary PB1 with the first child power line portion 1120.

The first child power line portion 1120 may be branched from a portion of the parent power line portion 1110 and be disposed to surround the parent power line portion 1110. The first child power line portion 1120 may extend from one end positioned at the boundary PB1 with the parent power line portion 1110 in the form of a '⊏' pattern or shape to reach the other end 1120E. A power line via PV connected to the first child power line portion 2120 of the second power trace pattern 2000a of FIG. 4 may be connected to the first child power line portion 1120. As illustrated in FIG. 3, the power line via PV of the first child power line portion 1120 may be disposed adjacent to the one end and the other end 1120E of the first child power line portion 1120.

A second child power line portion 1130 may be branched from a portion of the first child power line portion 1120 and may be disposed to surround the first child power line portion 1120 and the parent power line portion 1110. The second child power line portion 1130 may be branched from one end located at a boundary PB2 with the first child power line portion 1120 in the form of a '⊏' pattern or shape to reach the other end 1130E. A power line via PV connected to the second child power line portion 2130 of the second power trace pattern 2000a of FIG. 4 may be connected to the second child power line portion 1130. As illustrated in FIG. 3, the power line via PV of the second child power line portion 1130 may be disposed adjacent to the one end and the other end 1130E of the second child power line portion 1130.

A third child power line portion 1140 may be branched from a portion of the second child power line portion 1130 and may be disposed to surround the second child power line portion 1130, the first child power line portion 1120 and the parent power line portion 1110. The third child power line portion 1140 may extend from one end located at a boundary PB3 with the second child power line portion 1130 in the form of a '⊏' pattern or shape to reach the other end 1140E. A power line via PV connected to the third child power line portion 2140 of the second power trace pattern 2000a of FIG. 4 may be connected to the third child power line portion 1140. As illustrated in FIG. 3, the power line via PV of the third child power line portion 1140 may be disposed adjacent to the other end 1140E of the third child power line portion 1140.

Referring back to FIG. 3, the first ground trace pattern 1000b may be disposed adjacent to the first power trace pattern 1000a. The parent ground line portion 1210 may be disposed adjacent to the parent power line portion 1110. The parent ground line portion 1210 may extend from one end connected to the ground pad 1201 in the x-direction to reach the other end 1210E.

A ground line via GV connected to the parent ground line portion 2210 of the second ground trace pattern 2000b of FIG. 4 may be connected to the parent ground line portion 1210. As illustrated in FIG. 4, the ground line via GV may be disposed adjacent to the power line via PV in the center of the first trace pattern 1000. The first child ground line portion 1220 may be branched from a portion of the parent ground line portion 1210 and may be disposed to surround the parent ground line portion 1210. The first child ground line portion 1220 may extend from one end located in a boundary GB1 with the parent ground line portion 1210 in the form of a '⊏' pattern or shape to reach the other end 1220E. A ground line via GV connected to the first child ground line portion 2220 of the second ground trace pattern 2000b of FIG. 4 may be connected to the first child ground line portion 1220. As shown in FIG. 3, the ground line via GV of the first child ground line portion 1220 may be disposed adjacent to the one end and the other end 1220E of the first child ground line portion 1220.

A second child ground line portion 1230 may be branched from a portion of the first child ground line portion 1220 and may be disposed to surround the first child ground line portion 1220 and the parent ground line portion 1210. The second child ground line portion 1230 may extend from one end located in a boundary GB2 with the first child ground line portion 1220 in the form of a '⊏' pattern or shape to reach the other end 1230E. A ground line via GV connected to the second child ground line portion 2230 of the second ground trace pattern 2000b of FIG. 4 may be connected to the second child ground line portion 1230. As illustrated in FIG. 3, the ground line via GV of the second child ground line portion 1230 may be disposed adjacent to the one end and the other end 1230E of the second ground line portion 1230.

The third child ground line portion 1240 may be branched from a portion of the second child ground line portion 1230 and may be disposed to surround the second child ground line portion 1230, the first child ground line portion 1220, and the parent ground line portion 1210. The third child ground line portion 1240 may extend from one end located in a boundary GB3 with the second child ground line portion 1230 in the form of a '⊏' pattern or shape to reach the other end 1240E. A ground line via GV connected to the third ground line portion 2240 of the second ground trace pattern 2000b of FIG. 4 may be connected to the third child ground line portion 1240. As illustrated in FIG. 3, the ground line via GV of the third child ground line portion 1240 may be disposed adjacent to the other end 1240E of the third ground line portion 1240.

Referring back to FIG. 3, the parent power line portion 1110 may be disposed to surround the parent ground line portion 1210, the first child ground line portion 1220 may be disposed to surround the parent power line portion 1110, the first child power line portion 1120 may be disposed to surround the first child ground line portion 1220, the second child ground line portion 1230 may be disposed to surround the first child power line portion 1120, the second child power line portion 1130 may be disposed to surround the second ground line portion 1230, the third child ground line portion 1240 may be disposed to surround the second child power line portion 1130, and the third child power line portion 1140 may be disposed to surround the third child ground line portion 1240. As described above, the first power trace pattern 1000a and the first ground trace pattern 1000b may be alternately arranged along the lateral direction on the first surface S1 of the package substrate 100 described above with reference to FIG. 1. Meanwhile, in FIG. 3, three child power line portions are illustrated, but the present disclosure is not limited thereto. The first power trace pattern 1000a may include at least one or more various numbers of child power line portions. Similarly, in FIG. 3, three child ground line portions are illustrated, but the present disclosure is not limited thereto. The first ground trace pattern 1000b may include at least one or more various numbers of child ground line portions.

Referring to FIG. 4, a second trace pattern 2000 is disclosed. The second trace pattern 2000 may include a second power trace pattern 2000a and a second ground trace pattern 2000b. The second power trace pattern 2000a may include a parent power line portion 2110 and first to third child power line portions 2120, 2130, and 2140 branched from the parent power line portion 2110. The second ground trace pattern 2000b may include a parent ground line portion 2210 and first to third child ground line portions 2220, 2230, and 2240 branched from the parent ground line portion 2210.

The second power trace pattern 2000a and the second ground trace pattern 2000b may be disposed adjacent to each other. The second power trace pattern 2000a and the second ground trace pattern 2000b may be electrically insulated from each other by being spaced apart from each other. A second insulation layer 2300 that functions as a dielectric may be disposed between the second power trace pattern 2000a and the second ground trace pattern 2000b. Accordingly, a capacitor element having substantially the same configuration as the first capacitor element C1 described with reference to FIG. 2A may be formed in a region where the second power trace pattern 2000a, the second insulation layer 2300 and the first ground trace pattern 2000b overlap each other.

The arrangement of the second power trace pattern 2000a and the second ground trace pattern 2000b may be substantially the same as the arrangement of the first power trace pattern 1000a and the first ground trace pattern 1000b described above with reference to FIG. 3. In an embodiment, at least a portion of the second power trace pattern 2000a may be disposed to surround at least a portion of the second ground trace pattern 2000b, and at least a portion of the second ground trace pattern 2000b may be disposed to surround at least a portion of the second power trace pattern 2000a.

Referring to FIG. 4, a parent power line portion 2110 of the second power trace pattern 2000a may be disposed to extend in the x-direction. The parent power line portion 2210 may have one end located at a boundary PB4 with a first child power line portion 2120 and the other end 2110E extending in the x-direction. In addition, a plurality of power line vias PV may be connected to the parent power line portion 2110. The plurality of power line vias PV may electrically connect the parent power line portion 2110 of the second power trace pattern 2000a to the parent power line portion 1110 of the first power trace pattern 1000a.

The first child power line portion 2120 may be branched from a portion of the parent power line portion 2110 and may be disposed to surround the parent power line portion 2110. The first child power line portion 2120 may extend from one end located at a boundary PB4 with the parent power line portion 2110 in the form of a 'ㄷ' pattern or shape to reach the other end 2120E. A plurality of power line vias PV connected to the first child power line portion 1120 of the first power trace pattern 1000a of FIG. 3 may be connected to the first child power line portion 2120.

A second child power line portion 2130 may be branched from a portion of the first child power line portion 2120 and may be disposed to surround the first child power line portion 2120 and the parent power line portion 2110. The second child power line portion 2130 may extend from one end located at a boundary PB5 with the first child power line portion 2120 in the form of a 'ㄷ' pattern or shape to reach the other end 2130E. The plurality of power line vias PV connected to the second child power line portion 1130 of the first power trace pattern 1000a of FIG. 3 may be connected to the second child power line portion 2130.

A third child power line portion 2140 may be branched from a portion of the second child power line portion 2130 and may be disposed to surround the second child power line portion 2130, the first child power line portion 2120 and the parent power line portion 2110. The third child power line portion 2140 may extend from one end located at a boundary PB6 with the second child power line portion 2130 in the form of a 'ㄷ' pattern or shape to reach the other end 2140E. The plurality of power line vias PV connected to the third child power line portion 1140 of the first power trace pattern 1000a of FIG. 3 may be connected to the third child power line portion 2140.

Referring back to FIG. 4, a parent ground line portion 2210 of the second ground trace pattern 2000b may be disposed adjacent to the parent power line portion 2110. The parent ground line portion 2210 may be disposed to surround the parent power line portion 2110. A ground line via GV connected to the parent ground line portion 1210 of the first ground trace pattern 1000b of FIG. 3 may be connected to the parent ground line portion 2210.

The first child ground line portion 2220 may be branched from a portion of the parent ground line portion 2210 and may be disposed to surround the parent ground line portion 2210. The first child ground line portion 2220 may extend from one end located at a boundary GB4 with the parent ground line portion 2210 in the form of a 'ㄷ' pattern or shape to reach the other end 2220E. A ground line via GV connected to the first child ground line portion 1220 of the first ground trace pattern 1000b of FIG. 3 may be connected to the first child ground line portion 2220.

The second child ground line portion 2230 may be branched from a portion of the first child ground line portion 2220 and may be disposed to surround the first child ground line portion 2220 and the parent ground line portion 2210. The second child ground line portion 2230 may extend from one end located at a boundary GB5 with the first child line portion 2220 in the form of a 'ㄷ' pattern or shape to reach the other end 2230E. A ground via GV connected to the second child ground line portion 1230 of the first ground trace pattern 1000b of FIG. 3 may be connected to the second child ground line portion 2230.

A third child ground line portion 2240 may be branched from a portion of the second child ground line portion 2230 and may be disposed to surround the second child ground line portion 2230, the first child ground line portion 2220 and the parent ground line portion 2210. The third child ground line portion 2240 may extend from one end located at a boundary GB6 with the second child ground line portion 2230 in the form of a '⌐' pattern or shape to reach the other end 2240E. A ground line via GV connected to the third ground line portion 1240 of the first ground trace pattern 1000b of FIG. 3 may be connected to the third child ground line portion 2240.

Referring back to FIG. 4, the parent ground line portion 2210 may be disposed to surround the parent power line portion 2110, the first child power line portion 2120 may be disposed to surround the parent ground line portion 2210, the first child ground line portion 2220 may be disposed to surround the first child power line portion 2120, the second child power line portion 2130 may be disposed to surround the first child ground line portion 2220, the second child ground line portion 2230 may be disposed to surround the second child power line portion 2130, the third child power line portion 2140 may be disposed to surround the second child ground line portion 2230, and the third child ground line portion 2240 may be disposed to surround the third child power line portion 2140.

Referring to FIGS. 5A and 5B, a pattern stack structure 3000 in which the first trace pattern 1000 of FIG. 3 and the second trace pattern 2000 of FIG. 4 are connected through vias is disclosed. Referring to FIGS. 1, 5A and 5B together, the first power trace pattern 1000a and the first ground trace pattern 1000b located on the first surface S1, shown in FIG. 1, and the second ground trace pattern 2000b and the second power trace pattern 2000a located on the second surface S2, shown in FIG. 1, may be disposed to correspond to each other. That is, the first power trace pattern 1000a and the second ground trace pattern 2000b may be disposed to overlap each other in a direction perpendicular to the first surface S1 and the second surface S2. The first ground trace pattern 1000b and the second power trace pattern 2000a may be disposed to overlap each other in a direction perpendicular to the first surface S1 and the second surface S2. A third insulation layer 3100 that functions as a dielectric may be disposed in a space S3000 between the first trace pattern 1000 on the first surface S1 and the second trace pattern 2000 on the second surface S2.

Through this, as described above with reference to FIGS. 2B and 2C, the first power trace pattern 1000a, the interlayer insulation layer, and the second ground trace pattern 2000b may constitute a capacitor element in a direction perpendicular to the first surface S1 and the second surface S2. In addition, the first ground trace pattern 1000b, the interlayer insulation layer, and the second power trace pattern 2000a may constitute a capacitor element in a direction perpendicular to the first surface S1 and the second surface S2. The capacitor elements can supply electric charges to the first and second power trace patterns 1000a and 2000a, respectively. Accordingly, during operation of a semiconductor package that consumes external power, the capacitor elements can quickly replenish the consumed external power with new power, thereby stably maintaining a supply of power in the semiconductor package.

Meanwhile, the plurality of power line vias PV may electrically connect the first power trace pattern 1000a to the second power trace pattern 2000a. Accordingly, the first power trace pattern 1000a and the second power trace pattern 2000a may be electrically connected in parallel to each other. Similarly, the plurality of ground line vias GV may electrically connect the first ground trace pattern 1000b to the second ground trace pattern 2000b. Accordingly, the first ground trace pattern 1000b and the second ground trace pattern 2000b may be electrically connected in parallel to each other.

Referring back to FIG. 1, in the semiconductor package 1, the power supplied from an external system may be input to the connection structures 150 and output through the second wiring 130 including the bump pad 140, the second via 162, the second power trace pattern 2000a and the second ground trace pattern 2000b, the first via 161 including the power line via PV and the ground line via GV, the first wiring 120 including the first power trace pattern 1000a and the first ground trace pattern 1000b, and the bonding pad 110 including the power pad 1101 and the ground pad 1201 to be transferred to the semiconductor chip 200. The plurality of power line vias PV can increase a path of power supply from the second power trace pattern 2000a to the first power trace pattern 1000a. As described above, the semiconductor package 1 has a plurality of power supply paths such that the power can be smoothly supplied to the semiconductor package.

The plurality of ground line vias GV can electrically connect the first and second ground trace patterns 1000b and 2000b to each other to stabilize the ground potential. The first and second ground trace patterns 1000b and 2000b may be connected to a ground line of an external system through the connection structures 150.

As described above, according to embodiments of the present disclosure, a semiconductor package capable of effectively transmitting external power to a semiconductor chip through a package substrate can be provided by controlling an arrangement of power trace patterns, ground trace patterns, power line vias, and ground line vias in the package substrate.

A limited number of possible embodiments for the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A package substrate comprising:
   a substrate body; and
   a first power trace pattern and a first ground trace pattern disposed on a first surface of the substrate body,
   wherein the first power trace pattern comprises a parent power line portion and at least one child power line portion branched from the parent power line portion,
   wherein the first ground trace pattern comprises a parent ground line portion and at least one child ground line portion branched from the parent ground line portion, and
   wherein at least a portion of the first power trace pattern is disposed to surround at least a portion of the first ground trace pattern, and at least a portion of the first ground trace pattern is disposed to surround at least a portion of the first power trace pattern.

2. The package substrate of claim 1, further comprising a power pad and a ground pad disposed on the first surface and electrically connected to a semiconductor chip mounted on the package substrate,
   wherein the power pad is connected to an end of the first power trace pattern, and wherein the ground pad is connected to an end of the first ground trace pattern.

3. The package substrate of claim 1, wherein the at least one child power line portion is disposed to surround the parent power line portion, and
wherein the at least one child ground line portion is disposed to surround the parent ground line portion.

4. The package substrate of claim 1, wherein the at least one child power line portion comprises:
a first child power line portion branched from the parent power line portion; and
a second child power line portion branched from the first child power line portion,
wherein the at least one child ground line portion comprises:
a first child ground line portion branched from the parent ground line portion; and
a second child ground line portion branched from the first child ground line portion.

5. The package substrate of claim 4,
wherein the parent power line portion surrounds the parent ground line portion,
wherein the first child ground line portion surrounds the parent power line portion,
wherein the first child power line portion surrounds the first child ground line portion,
wherein the second child ground line portion surrounds the first child power line portion, and
wherein the second child power line portion surrounds the second child ground line portion.

6. The package substrate of claim 4,
wherein the parent ground line portion surrounds the parent power line portion,
wherein the first child power line portion surrounds the parent ground line portion,
wherein the first child ground line portion surrounds the first child power line portion,
wherein the second child power line portion surrounds the first child ground line portion, and
wherein the second child ground line portion surrounds the second child power line portion.

7. The package substrate of claim 1, further comprising a second power trace pattern and a second ground trace pattern disposed on a second surface different from the first surface of the substrate body,
wherein the second power trace pattern includes a parent power line portion and at least one child power line portion branched from the parent power line portion, and
wherein the second ground trace pattern includes a parent ground line portion and at least one child ground line portion branched from the parent ground line portion.

8. The package substrate of claim 7, further comprising:
a first insulation layer disposed between the first power trace pattern and the first ground trace pattern on the first surface;
a second insulation layer disposed between the second power trace pattern and the second ground trace pattern on the second surface; and
a third insulation layer disposed in a space between the first surface and the second surface.

9. The package substrate of claim 7, further comprising:
a power line via electrically connecting the first power trace pattern on the first surface to the second power trace pattern on the second surface; and
a ground line via electrically connecting the first ground trace pattern on the first surface to the second ground trace pattern on the second surface.

10. The package substrate of claim 9, wherein the power line via and the ground line via are arranged as an adjacent pair between the first surface and the second surface.

11. The package substrate of claim 7,
wherein the first power trace pattern and the second ground trace pattern overlap each other in a direction perpendicular to the first surface and the second surface, and
wherein the first ground trace pattern and the second power trace pattern overlap each other in a direction perpendicular to the first surface and the second surface.

12. The package substrate of claim 11,
wherein the parent power line portion of the first power trace pattern overlaps the parent ground line portion of the second ground trace pattern,
wherein the at least one child power line portion of the first power trace pattern overlaps the at least one child ground line portion of the second ground trace pattern,
wherein the parent ground line portion of the first ground trace pattern overlaps the parent power line portion of the second power trace pattern, and
wherein the at least one child ground line portion of the first ground trace pattern overlaps the at least one child power line portion of the second power trace pattern.

13. A semiconductor package comprising:
a package substrate and a semiconductor chip mounted on the package substrate,
wherein the package substrate comprises:
a substrate body having a first surface and a second surface different from the first surface;
a first power trace pattern and a first ground trace pattern alternately disposed on the first surface, and
a second power trace pattern and a second ground trace pattern alternately disposed on the second surface,
wherein the first and second power trace patterns are electrically connected to each other by power line vias and the first and second ground patterns are electrically connected to each other by ground line vias,
wherein the first power trace pattern and the second ground trace pattern are disposed to overlap each other in a direction perpendicular to the first and second surfaces, and
wherein the first ground trace pattern and the second power trace pattern are disposed to overlap each other in a direction perpendicular to the first and second directions.

14. The semiconductor package of claim 13, further comprising:
a first insulation layer disposed between the first power trace pattern and the first ground trace pattern on the first surface;
a second insulation layer disposed between the second power trace pattern and the second ground trace pattern on the second surface; and
a third insulation layer disposed in a space between the first surface and the second surface.

15. The semiconductor package of claim 13, further comprising a power pad and a ground pad disposed on the first surface and electrically connected to the semiconductor chip,
wherein the power pad is connected to an end of the first power trace pattern, and wherein the ground pad is connected to an end of the first ground trace pattern.

16. The semiconductor package of claim 13,
wherein at least a portion of the first power trace pattern is disposed to surround at least a portion of the first ground trace pattern, and at least a portion of the first ground trace pattern is disposed to surround at least a portion of the first power trace pattern, on the first surface, and
wherein at least a portion of the second power trace pattern is disposed to surround at least a portion of the second ground trace pattern, and at least a portion of the second ground trace pattern is disposed to surround at least a portion of the second power trace pattern, on the second surface.

17. The semiconductor package of claim 13,
wherein each of the first and second power trace patterns has a parent power line portion and at least one child power line portion branched from the parent power line portion,
wherein each of the first and second ground trace patterns has a parent ground line portion and at least one child ground line portion branched from the parent ground line portion, wherein in each of the first and second power trace patterns, the at least one child power line portion is disposed to surround the parent power line portion, and
wherein in each of the first and second ground trace patterns, the at least one child ground line portion is disposed to surround the parent ground line portion.

18. The semiconductor package of claim 17,
wherein in each of the first and second power trace patterns, the at least one child power line portion comprises:
a first child power line portion branched from the parent power line portion; and
a second child power line portion branched from the first child power line portion,
wherein in each of the first and second ground trace patterns, the at least one child ground line portion comprises:
a first child ground line portion branched from the parent ground line portion; and
a second child ground line portion branched from the first child ground line portion.

19. The semiconductor package of claim 18, wherein on the first surface:
the parent power line portion of the first power trace pattern surrounds the parent ground line portion of the first ground trace pattern;
the first child ground line portion of the first ground trace pattern surrounds the parent power line portion of the first power trace pattern;
the first child power line portion of the first power trace pattern surrounds the first child ground line portion of the first ground trace pattern;
the second child ground line portion of the first ground trace pattern surrounds the first child power line portion of the first power trace pattern; and
the second child power line portion of the first power trace pattern surrounds the second ground line portion of the first ground trace pattern.

20. The semiconductor package of claim 19, wherein on the second surface:
the parent ground line portion of the second ground trace pattern surrounds the parent power line portion of the second power trace pattern;
the first child power line portion of the second power trace pattern surrounds the parent ground line portion of the second ground trace pattern;
the first child ground line portion of the second ground trace pattern surrounds the first child power line portion of the second power trace pattern;
the second child power line portion of the second power trace pattern surrounds the first child ground line portion of the second ground trace pattern; and
the second child ground line portion of the second ground trace pattern surrounds the second child power line portion of the second power trace pattern.

* * * * *